(12) United States Patent
Uemura (10) Patent No.: US 8,164,738 B2
(45) Date of Patent: Apr. 24, 2012

(54) ILLUMINATION OPTICAL SYSTEM, EXPOSURE APPARATUS, AND DEVICE MANUFACTURING METHOD

(75) Inventor: Takanori Uemura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 805 days.

(21) Appl. No.: 11/847,194

(22) Filed: Aug. 29, 2007

(65) Prior Publication Data

US 2008/0062541 A1 Mar. 13, 2008

(30) Foreign Application Priority Data

Sep. 12, 2006 (JP) .................................. 2006-246590

(51) Int. Cl.
*G03B 27/54* (2006.01)
(52) U.S. Cl. ............................ 355/67; 359/709; 362/339
(58) Field of Classification Search ................... 355/67; 359/708, 709, 715, 837; 362/337, 339
See application file for complete search history.

(56) References Cited

U.S. PATENT DOCUMENTS

| | | | | |
|---|---|---|---|---|
| 6,236,449 | B1 * | 5/2001 | Tanitsu | 355/67 |
| 6,452,662 | B2 * | 9/2002 | Mulkens et al. | 355/67 |
| 6,897,944 | B2 | 5/2005 | Shiozawa | |
| 2001/0046038 | A1 * | 11/2001 | Mulkens et al. | 355/67 |
| 2002/0085276 | A1 | 7/2002 | Tanitsu et al. | |
| 2004/0021845 | A1 | 2/2004 | Kawahara | |
| 2004/0246456 | A1 | 12/2004 | Shiozawa | |
| 2006/0072095 | A1 * | 4/2006 | Kudo et al. | 355/67 |
| 2006/0146384 | A1 * | 7/2006 | Schultz et al. | 359/9 |

FOREIGN PATENT DOCUMENTS

| | | |
|---|---|---|
| JP | 2002-231619 A | 8/2002 |
| JP | 2003-297727 A | 10/2003 |
| JP | 2004-063988 A | 2/2004 |

* cited by examiner

*Primary Examiner* — Hung Henry Nguyen
*Assistant Examiner* — Steven H Whitesell Gordon
(74) *Attorney, Agent, or Firm* — Canon U.S.A., Inc. IP Division

(57) ABSTRACT

In an illumination optical system arranged to illuminate an illumination target plane by using light from a light source, the illumination optical system includes a prism unit arranged to refract the light, an optical integrator arranged to form a plurality of light sources with light emerging from the prism unit, and an optical system arranged to introduce light emerging from the optical integrator to the illumination target plane. The prism unit includes a pair of conical refractive surface having a conical concave refractive surface and a conical convex refractive surface, and a pair of pyramidal refractive surface having a pyramidal concave refractive surface and a pyramidal convex refractive surface. At least one of the concave refractive surface and the convex refractive surface of the one pair is disposed between the concave refractive surface of the other pair and the convex refractive surface of the other pair.

13 Claims, 7 Drawing Sheets

FIG. 1

FIG. 2A
INCIDENT LIGHT BEAM

FIG. 2B
WHEN INTERVAL BETWEEN REFRACTIVE SURFACES IS SMALL

FIG. 2C
WHEN INTERVAL BETWEEN REFRACTIVE SURFACES IS LARGE

FIG. 3A
INCIDENT LIGHT BEAM

FIG. 3B
WHEN INTERVAL BETWEEN REFRACTIVE SURFACES IS SMALL

FIG. 3C
WHEN INTERVAL BETWEEN REFRACTIVE SURFACES IS LARGE

FIG. 4A
INCIDENT LIGHT BEAM

FIG. 4B
WHEN INTERVAL BETWEEN FIRST SUBUNIT AND SECOND SUBUNIT IS SMALL

FIG. 4C
WHEN INTERVAL BETWEEN FIRST SUBUNIT AND SECOND SUBUNIT IS LARGE

FIG. 5A
INCIDENT LIGHT BEAM

FIG. 5B
WHEN INTERVAL BETWEEN FIRST SUBUNIT AND SECOND SUBUNIT IS SMALL

FIG. 5C
WHEN INTERVAL BETWEEN SECOND SUBUNIT AND THIRD SUBUNIT IS SMALL

ILLUMINATION OPTICAL SYSTEM, EXPOSURE APPARATUS, AND DEVICE MANUFACTURING METHOD

BACKGROUND OF THE INVENTION

1. Field of the Invention

The present invention relates to an illumination optical system, an exposure apparatus, and a device manufacturing method.

2. Description of the Related Art

Recently, there has increased a demand for further miniaturization of semiconductor devices. The K1 coefficient (=resolution line width×numerical aperture of projection optical system/wavelength), which is called resolution latitude, has decreased beyond 0.35 and now reaches a level of 0.3 or less. Many proposals for more effectively utilizing the photolithography have been made to meet such a demand. In other words, Super-High Resolution Technology also called RET (Resolution Enhancement Technology) has been proposed. One example of the RET is to apply an auxiliary pattern and/or a line width offset to a reticle pattern depending on optical characteristics of an exposure optical system.

Another example capable of providing an advantage comparable to or better than that obtained with optimization of a reticle is a method of optimizing the shape of an effective light source of an illumination optical system depending on the reticle pattern. Such a method is generally called Modified Illumination Method (or Super-High Resolution by Illumination Control). The term "effective light source" means a light intensity distribution in the pupil plane of an illumination optical system or an angle distribution of light incident upon a target surface to be illuminated (i.e., a reticle plane).

As the Modified Illumination Method, multipole illumination using a plurality of poles, such as a dipole or a quadrupole, has recently become more important. Particularly, the multipole illumination is often practiced in a shape obtained by cutting a desired angular range from an annular distribution. An annular ratio and an opening angle are used as parameters of the multipole illumination in many cases. The annular ratio is defined as a ratio of an inner radius/an outer radius of the effective light source distribution. The opening angle is defined as an angle formed by each pole relative to the center of a light beam, i.e., an optical axis.

As one example for producing the multipole modified illumination, there is known a method of arranging a prism having a concave refractive surface and a prism having a convex refractive surface on the side closer to a light source than an integrator (which is disposed in a conjugate plane with respect to the pupil of a projection optical system) in an illumination system, and of zoom-moving the prisms. With the zoom-moving of the prisms, the annular ratio and the opening angle of an effective light source can be adjusted. Further, a zoom lens having a variable focal length is arranged downstream of the prisms to enlarge and reduce a light intensity distribution formed on the integrator.

For example, Japanese Patent Laid-Open No. 2003-297727 describes a method of arranging, downstream of a first prism unit comprising a pair of concave and convex surfaces with complementary refractive powers, a second prism unit comprising a pair of concave and convex surfaces with complementary refractive powers. Herein, the term "complementary" means that refractive indices are substantially the same, and that the convex surface and the concave surface have substantially the same shape in match with each other.

Also, Japanese Patent Laid-Open No. 2004-63988 describes a method of producing multipole illumination by forming an annular distribution with a conical refractive surface, and by arranging a light blocking member for angle restriction downstream of the conical refractive surface.

Meanwhile, it has recently been demanded by device makers to change, in match with a reticle pattern, the annular ratio while keeping the opening angle constant, or the opening angle while keeping the annular ratio constant. The annular ratio can be changed while keeping the opening angle constant by the known method of arranging the light blocking member for angle restriction downstream of the conical refractive surface and zoom-moving the conical refractive surface.

With the known method, however, a large loss in quantity of light is resulted because the light blocking member absorbs the light. On the other hand, if the pair of concave and convex refractive surfaces with complementary refracting actions is just zoom-moved without using the light blocking member, a problem arises in that the annular ratio and the opening angle are both changed.

SUMMARY OF THE INVENTION

An aspect of the present invention is that it provides an illumination optical system which can adjust the shape of an effective light source while suppressing a reduction of illumination efficiency. According to one aspect of the present invention, an illumination optical system arranged to illuminate an illumination target plane by using light from a light source includes a prism unit arranged to refract the light, an optical integrator arranged to form a plurality of light sources with light emerging from the prism unit, and an optical system arranged to introduce light emerging from the optical integrator to the illumination target plane. The prism unit includes a pair of conical refractive surface having a conical concave refractive surface and a conical convex refractive surface, and a pair of pyramidal refractive surface having a pyramidal concave refractive surface and a pyramidal convex refractive surface. At least one of the concave refractive surface and the convex refractive surface of the one pair is disposed between the concave refractive surface of the other pair and the convex refractive surface of the other pair.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate exemplary embodiments of the invention and, together with the description, serve to explain the principles of the invention.

DESCRIPTION OF THE EMBODIMENTS

Exemplary embodiments, features and aspects of the present invention will now be described in detail in accordance with the accompanying drawings.

First Exemplary Embodiment

Figure 1:
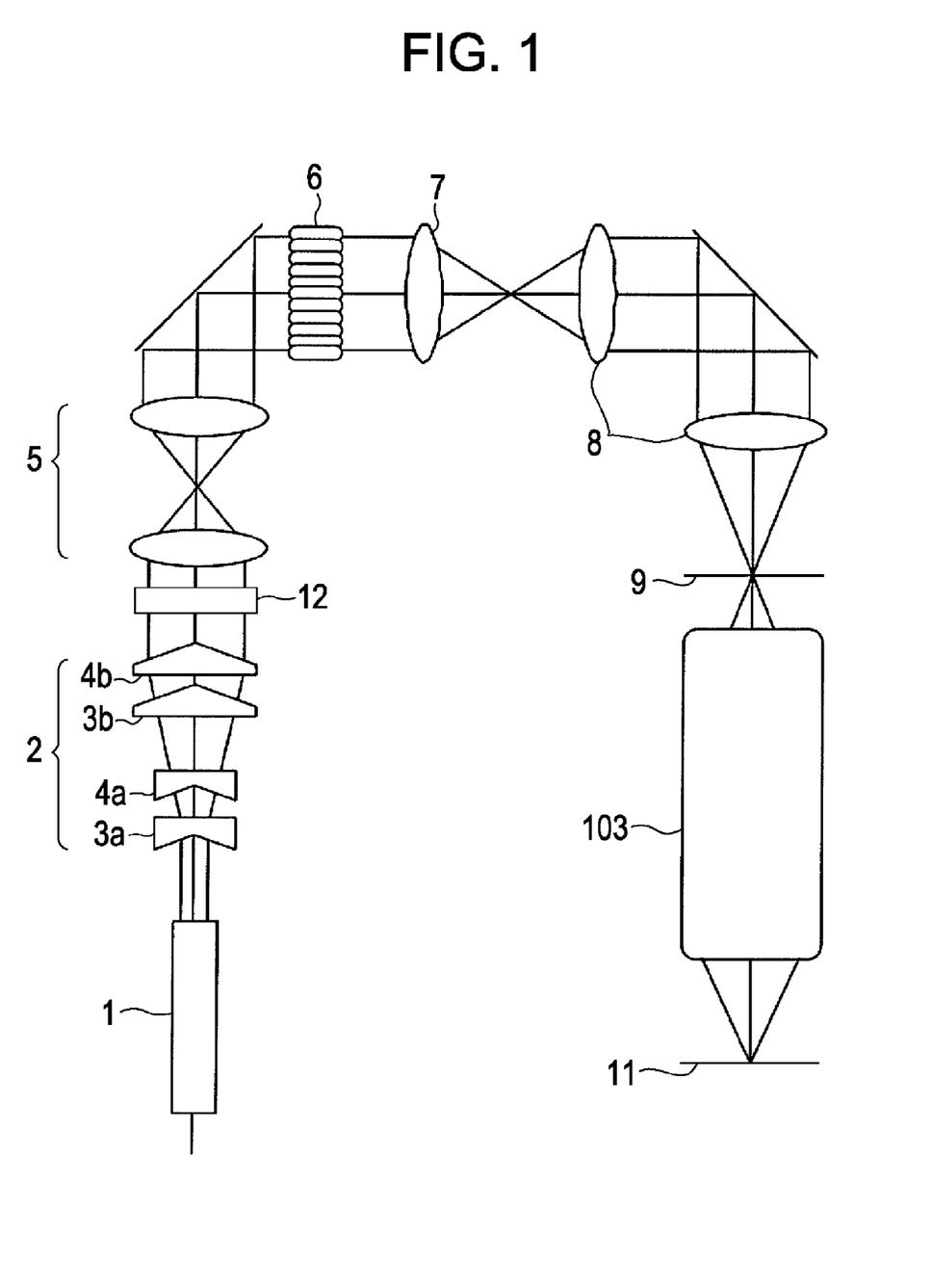
FIG. 1 is a schematic view of an example exposure apparatus to which is applied an illumination optical system according to a first exemplary embodiment of the present invention.

FIG. 1 is a schematic view of an exposure apparatus to which is applied an illumination optical system according to a first exemplary embodiment of the present invention. The exposure apparatus using the illumination optical system according to the first exemplary embodiment includes the illumination optical system, an original stage (not shown) on which is placed an original (reticle or mask) 9, a projection optical system 103, and a substrate stage (not shown) on which is placed a substrate (wafer) 11.

The illumination optical system according to the first exemplary embodiment includes a rod integrator 1, a prism unit 2, a zoom lens 5, a fly-eye integrator 6 serving as an optical integrator, and an aperture stop 12.

The optical integrator 6 is constituted by a plurality of small lenses which are two-dimensionally arranged, and it forms a plurality of secondary light sources near an emergent surface thereof. The optical integrator can be constituted, for example, by a fly-eye lens, a cylindrical lens array, a microlens array, or an optical pipe (rod).

The illumination optical system according to the first exemplary embodiment further includes an optical system for illuminating the original 9, which is disposed in an illumination target plane, with light emerging from the optical integrator. Such an optical system includes a condenser lens 7 and a masking imaging lens 8.

The prism unit 2 is made up of a first subunit comprising a prism 3a having a conical concave refractive surface and a prism 4a having a pyramidal concave refractive surface, and a second subunit comprising a prism 3b having a conical convex refractive surface and a prism 4b having a pyramidal convex refractive surface.

The rod integrator 1 converts light emitted from a light source (not shown) to light having a substantially uniform light intensity distribution at an emergent surface thereof. The rod integrator 1 is disposed with intent to suppress unevenness in the light intensity distribution of an effective light source. A similar effect to that of the rod integrator 1 can also be obtained by, instead of using the rod integrator 1, arranging a microlens unit or a diffraction optical element and placing a condenser lens behind it. A light beam emerging from the rod integrator 1 enters the prism unit 2, and the prism unit 2 produces multipole illumination. Details of the multipole illumination will be described later.

After the multipole illumination has been produced by the prism unit 2, the light beam enters the zoom lens 5. The zoom lens 5 enlarges and reduces the size of the effective light source without changing the shape of the effective light source.

Further, the fly-eye integrator 6 forms a plurality of secondary light sources to illuminate the original 9 in a superimposed manner through the condenser lens 7 and the masking imaging lens 8. A pattern of the original 9 is transferred to the substrate 11 through the projection optical system 103.

Figure 2A:
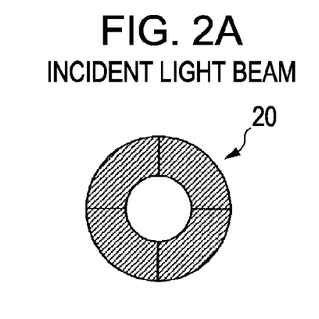
FIGS. 2A, 2B and 2C are explanatory views for explaining changes of an effective light source which are obtained with pyramidal refractive surfaces.

Prior to describing a method of producing the multipole illumination, an effective light source distribution formed by a pair of concave and convex pyramidal refractive surfaces 21 and 22 with complementary refracting actions is described with reference to FIGS. 2A, 2B and 2C. FIG. 2A illustrates an annular beam 20 entering one of the refractive surfaces.

Figure 2B:
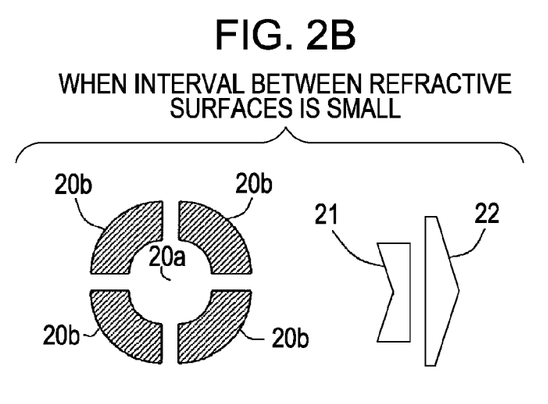
Figure 2C:
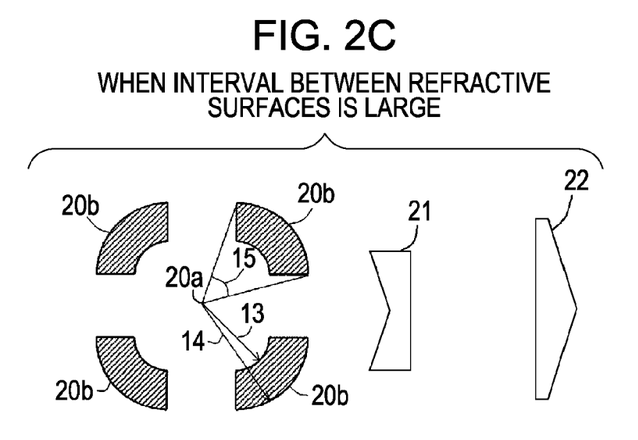

As illustrated in FIGS. 2B and 2C, the distance between an optical axis 20a and a pole 20b of each light beam emerging from the other refractive surface is increased as the interval between the refractive surfaces 21 and 22 increases.

On the other hand, because a radial width of the distribution is substantially constant, the annular ratio defined by (inner radius 13/outer radius 14) is increased consequently.

Also, as illustrated in FIGS. 2B and 2C, the position of each pole 20b is farther spaced from the center as the interval between the refractive surfaces 21 and 22 increases. It is therefore apparent that an opening angle 15 is reduced as the interval between the refractive surfaces 21 and 22 increases.

Thus, as the interval between the pair of concave and convex pyramidal refractive surfaces 21 and 22 with complementary refracting actions increases, the annular ratio is increased and the opening angle 15 is reduced.

Figure 3A:
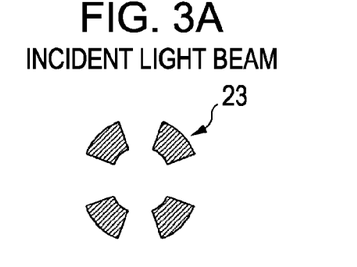
FIGS. 3A, 3B and 3C are explanatory views for explaining changes of the effective light source which are obtained with conical refractive surfaces.
Figure 3B:
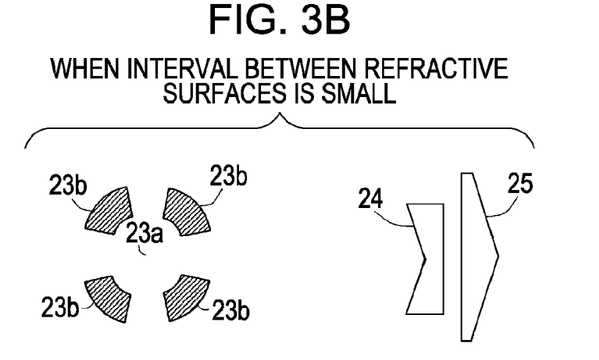
Figure 3C:
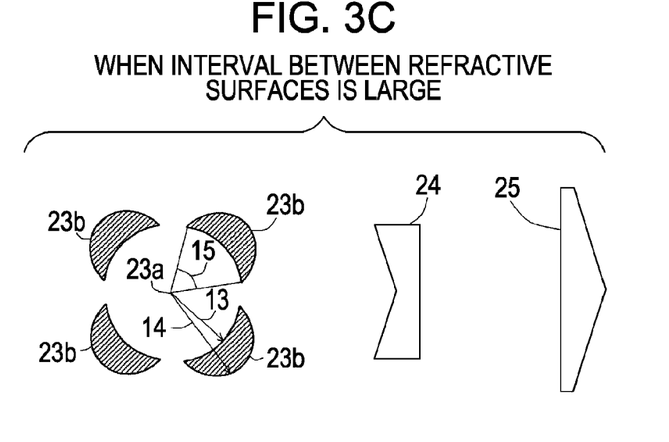

Next, an effective light source distribution formed by a pair of concave and convex conical refractive surfaces 24 and 25 with complementary refracting actions is described with reference to FIGS. 3A, 3B and 3C. FIGS. 3A, 3B and 3C illustrate the effective light source distribution formed by the pair of concave and convex conical refractive surfaces 24 and 25 with complementary refracting actions.

FIG. 3A illustrates a quadruple beam 23 entering one of the refractive surfaces 24 and 25. As illustrated in FIGS. 3B and 3C, each spot of the beam 23 is enlarged into an arc-shaped spot by the conical refractive surfaces 24 and 25. Therefore, each pole 23b about optical axis 23a of the emergent beam 23 has a shape shown in FIG. 3C. As the interval between the refractive surfaces 24 and 25 increases, the opening angle 15 is increased. Also, as the interval between the refractive surfaces 24 and 25 increases, the annular ratio defined by (inner radius 13/outer radius 14) is increased as in the case of the pyramidal refractive surfaces.

Thus, as seen from FIGS. 3B and 3C, in the prism unit using the pair of concave and convex conical refractive surfaces 24 and 25 with complementary refracting actions, as the interval between the conical refractive surfaces 24 and 25 increases, the annular ratio and the opening angle 15 are both increased.

In this first exemplary embodiment, the prism unit 2 includes the prism 3a having the conical concave refractive surface, the prism 4a having the pyramidal concave refractive surface, the prism 3b having the conical convex refractive surface, and the prism 4b having the pyramidal convex refractive surface, which are arranged in the order named from the light source side. The conical concave refractive surface and the pyramidal concave refractive surface are each a refractive surface having a concave refracting action, and the conical convex refractive surface and the pyramidal convex refractive surface are each a refractive surface having a convex refracting action. Herein, the conical refractive surfaces are formed such that the pair of concave and convex refractive surfaces has complementary refracting actions. The pyramidal refractive surfaces are also formed in a similar manner. The term "complementary" means that refractive indices are substantially the same, and that the convex surface and the concave surface have substantially the same shape in match with each other.

In this first exemplary embodiment, each concave refractive surface is formed on the side of the prism closer to the light source, and each convex refractive surface is formed on the side of the prism closer to the illumination target plane. Thus, the concave refractive surface is an incident surface, and the convex refractive surface is an emergent surface. Such an arrangement is advantageous in reducing the size of a spot generated by the refracting actions of the refractive surfaces.

However, a more compact optical system can be constituted by arranging the pyramidal concave refractive surface on the side of the prism closer to the illumination target plane and forming that prism to be integral with the prism having the conical concave refractive surface. In other words, the side on which the refractive surface is arranged is not necessarily limited to that illustrated in the first exemplary embodiment.

In the first exemplary embodiment, the second subunit comprising the prism 3b having the conical convex refractive surface and the prism 4b having the pyramidal convex refractive surface is movable in the direction of the optical axis of the illumination optical system such that the interval (relative distance) between the second subunit and the first subunit, which comprises, the prism 3a having the conical concave refractive surface and the prism 4a having the pyramidal concave refractive surface, is variable.

Although two pairs of concave and convex refractive surfaces are used, zooming is performed only by a single operation and a comparatively compact optical system is realized.

Figure 4A:
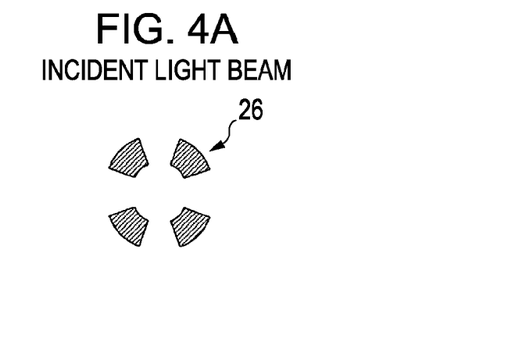
FIGS. 4A, 4B and 4C are explanatory views for explaining an effective light source formed by the illumination optical system according to the first exemplary embodiment of the present invention.
Figure 4B:
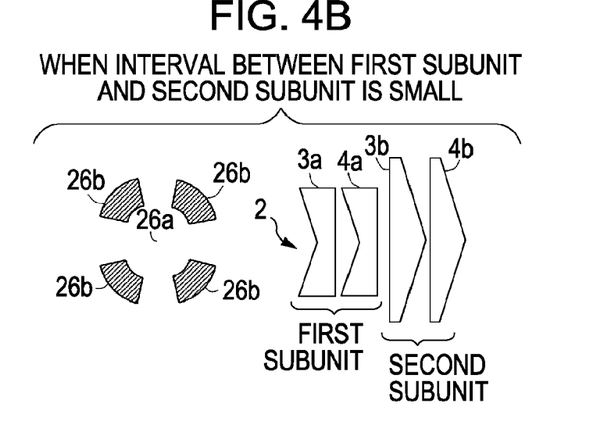
Figure 4C:
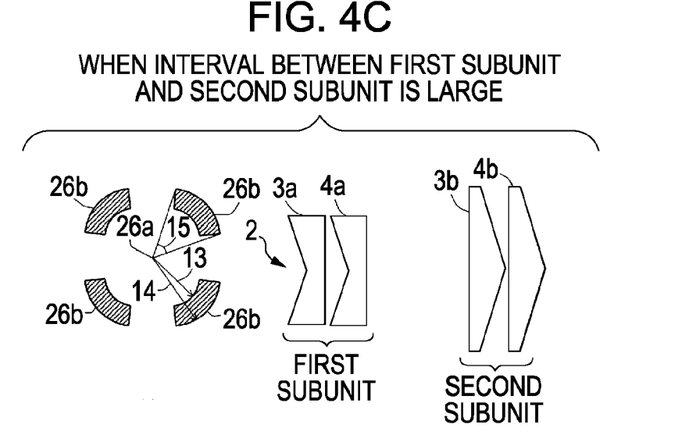

The shape of the effective light source formed by the prism unit 2 in the first exemplary embodiment will now be described with reference to FIGS. 4A, 4B and 4C. FIGS. 4A, 4B and 4C illustrate the case where a quadruple beam 26 enters the prism unit 2 wherein poles 26b are positioned about optical axis 26a. As described above, the pair of prisms 3a and 3b each having the conical refractive surface and the pair of prisms 4a and 4b each having the pyramidal refractive surface have an effect of increasing the annular ratio with an increase of the interval between the concave refractive surface and the convex refractive surface. Accordingly, as the interval between the first subunit and the second subunit increases, the above-mentioned effects of the two pairs of the refractive surfaces are additively developed and the annular ratio is increased correspondingly.

On the other hand, when the distance between the concave refractive surface and the convex refractive surface is increased, the pair of conical refractive surfaces develops an effect of increasing the opening angle 15, while the pair of pyramidal refractive surfaces develops an effect of reducing the opening angle 15.

Therefore, even when the distance between the first subunit and the second subunit is changed, influences of the pair of conical refractive surfaces and the pair of pyramidal refractive surfaces upon the opening angle 15 are cancelled and an overall change of the opening angle 15 is reduced.

Thus, according to the first exemplary embodiment, the annular ratio can be changed while suppressing the change of the opening angle 15 of the effective light source formed in the pupil plane of the projection optical system 13.

In the first exemplary embodiment described above, the prism 3a having the conical concave refractive surface, the prism 4a having the pyramidal concave refractive surface, the prism 3b having the conical convex refractive surface, and the prism 4b having the pyramidal convex refractive surface are arranged in the order named.

However, even when the four prisms are arranged as a modified example in the order of the prism 3a having the conical concave refractive surface, the prism 4a having the pyramidal concave refractive surface, the prism 4b having the pyramidal convex refractive surface, and the prism 3b having the conical convex refractive surface, an essentially similar effect can also be obtained although a difference is caused in the effective light source distribution.

While the first exemplary embodiment is able to suppress the change of the opening angle 15 smaller, the aperture stop 12 for blocking a part of the light beam can be disposed between the prism unit and the optical integrator in order to further reduce the change of the opening angle 15. The aperture stop 12 can also be disposed on the side of the zoom lens 5 closer to the light source. Although the aperture stop 12 causes a slight loss of light quantity, the opening angle 15 can be held substantially constant.

Second Exemplary Embodiment

A second exemplary embodiment of the present invention will now be described with reference to FIGS. 5A, 5B and 5C. This second exemplary embodiment has the same construction as the first exemplary embodiment of the present invention except that the prism unit 2 is made up of a first subunit comprising the prism 3a having the conical concave refractive surface, a second subunit comprising the prism 4a having the pyramidal concave refractive surface and the prism 3b having the conical convex refractive surface, and a third subunit comprising the prism 4b having the pyramidal convex refractive surface. In the second exemplary embodiment, the second subunit is movable in the direction of the optical axis of the illumination optical system.

Figure 5A:
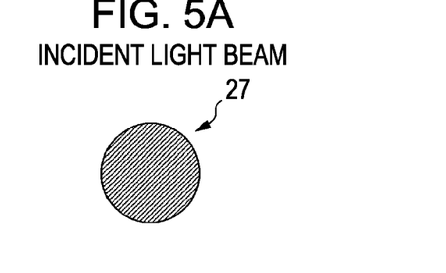
FIGS. 5A, 5B and 5C are explanatory views for explaining an effective light source formed by an illumination optical system according to a second exemplary embodiment of the present invention.
Figure 5B:
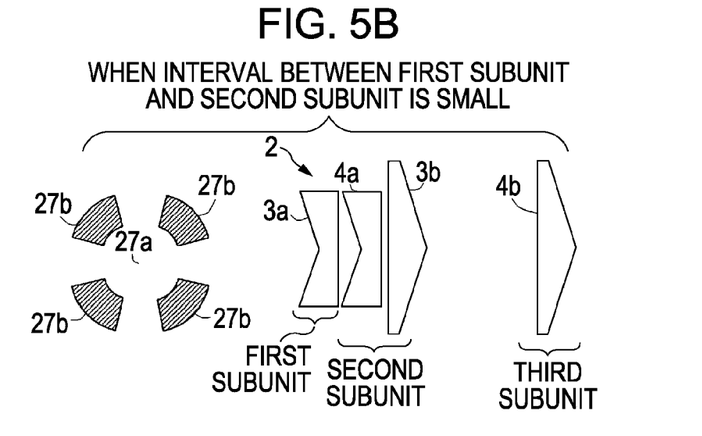
Figure 5C:
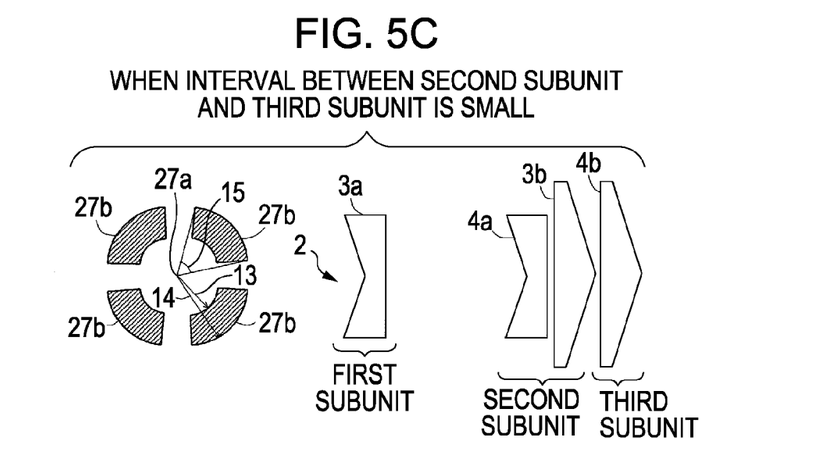

An effective light source formed in the second exemplary embodiment is illustrated in FIGS. 5A, 5B and 5C. FIGS. 5A, 5B and 5C illustrate the case where a circular beam 27 enters the refractive surface. As illustrated in FIG. 5B, poles 27b are positioned about optical axis 27a. Moreover, when the second subunit is positioned closer to the first subunit, the distance between the prisms 3a and 4a having the conical and pyramidal concave refractive surfaces is reduced and the distance between the prisms 3b and 4b having the conical and pyramidal convex refractive surfaces is increased.

On the other hand, as illustrated in FIG. 5C, when the second subunit is positioned closer to the third subunit, the distance between the prisms 3a and 4a having the conical and pyramidal concave refractive surfaces is increased and the distance between the prisms 3b and 4b having the conical and pyramidal convex refractive surfaces is reduced.

As described above, in each of the pair of conical refractive surfaces and the pair of pyramidal refractive surfaces, as the distance between the concave refractive surface and the convex refractive surface increases, the annular ratio is increased. In the second exemplary embodiment, when the distance between one pair of refractive surfaces is increased with zoom-moving of the second subunit, the distance between the other pair of refractive surfaces is reduced. As a result, changes of the annular ratio are canceled and maintained small. Regarding the opening angle 15, as the interval between the concave refractive surface and the convex refractive surface increases, the opening angle 15 is increased in the case of the conical refractive surfaces, but it is reduced in the case of the pyramidal refractive surfaces. Accordingly, influences of the two pairs of conical and pyramidal refractive surfaces upon the opening angle are additively generated with the movement of the second subunit.

Thus, when the second subunit is positioned close to the first subunit, the opening angle 15 is reduced, and when the second subunit is positioned close to the third subunit, the opening angle 15 is increased. Consequently, according to the second exemplary embodiment, the opening angle 15 can be changed while maintaining small the change of the annular ratio of the effective light source.

In the illustrated second exemplary embodiment, the second subunit comprises two prisms, i.e., the prism 4a having the pyramidal concave refractive surface and the prism 3b having the conical convex refractive surface. However, a more compact optical system can be constituted by forming opposite surfaces of a single prism to serve as the pyramidal concave refractive surface and the conical convex refractive surface, respectively.

The above-described exemplary embodiments are illustrated such that each refractive surface has an apex positioned near the optical axis. However, a more compact optical system can be constituted by chamfering a part of the refractive surface near the apex thereof so as to reduce the thickness of the prism having the relevant refractive surface in the direction of the optical axis.

Also, while the exemplary embodiments have been described above in connection with the case that a circular light beam enters the refractive surface, a light beam having an annular shape or a multipole shape can also be introduced by using, e.g., a diffraction optical element. In such a case, the degree of freedom in forming the effective light source distribution is further increased. In other words, the effective light source can be formed in a more variety of shapes.

According to the exemplary embodiments described above, the shape of the effective light source can be adjusted while suppressing a reduction of illumination efficiency. Further, by adjusting the positions of the subunits constituting the prism unit, one of the annular ratio and the opening angle of the effective light source can be changed while suppressing a change of the other.

Other Exemplary Embodiments

An exemplary embodiment of a device manufacturing method utilizing the foregoing exposure apparatus will now be described with reference to FIGS. 6 and 7.

Figure 6:
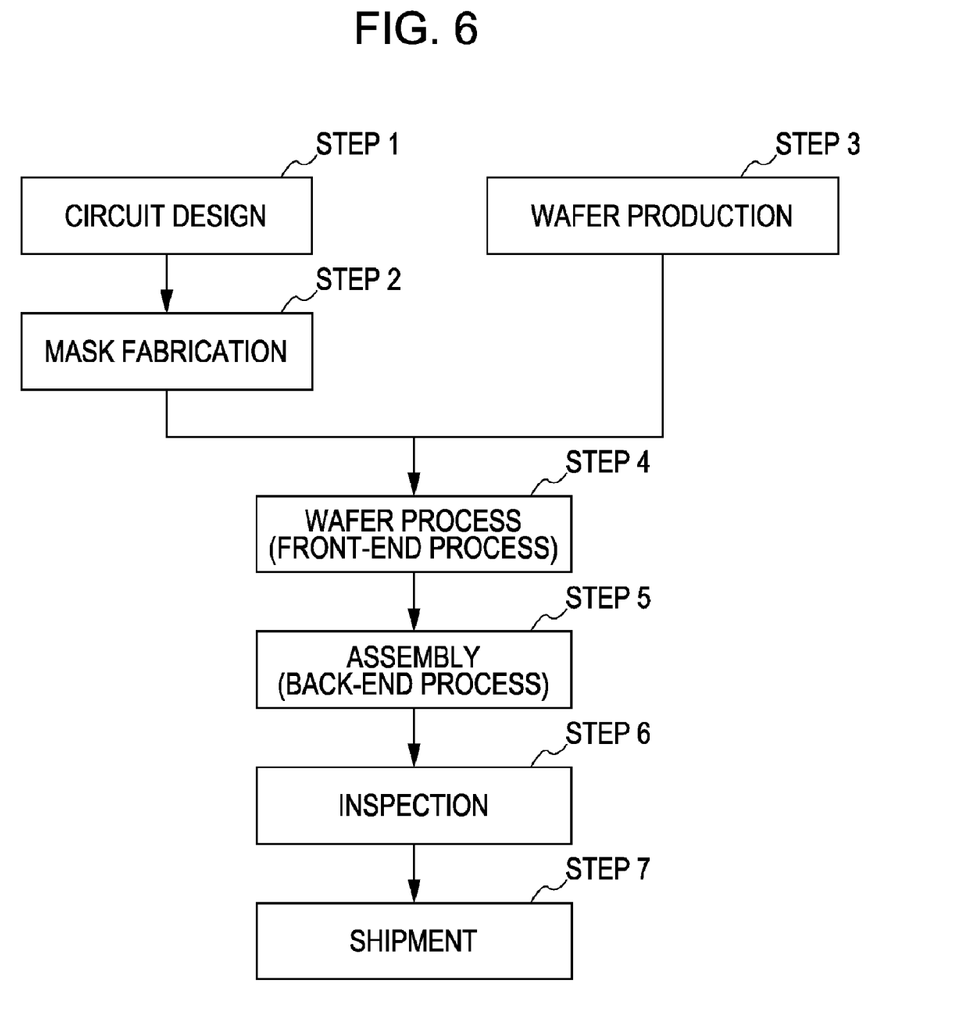
FIG. 6 is a flowchart for explaining a process of manufacturing a device by employing the exposure apparatus.

FIG. 6 is a flowchart for explaining a process of manufacturing a device (e.g., a semiconductor chip including IC and LSI, for example, as well as LCD or CCD). The manufacturing of the semiconductor chip will be described here by way of example. In step 1 (circuit design), circuit design of a semiconductor device is performed. In step 2 (mask fabrication), a mask is fabricated based on the designed circuit pattern. In step 3 (wafer production), a wafer (substrate) is produced by using silicon or some other suitable material. In step 4 (wafer process), which is also called a front-end process, an actual circuit is formed on the wafer by the above-described exposure apparatus based on the lithography technique using the mask and the wafer. In step 5 (assembly), which is also called a back-end process, the semiconductor device is manufactured in the form of a chip by using the wafer obtained in step 4. The back-end process includes an assembly step (dicing and bonding), a packaging step (chip encapsulation), and so on. In step 6 (inspection), inspection including an operation check test and a durability test, for example, is made on the semiconductor device manufactured in step 5. After the semiconductor device is completed through the above-described steps, the completed semiconductor device is shipped (step 7).

Figure 7:
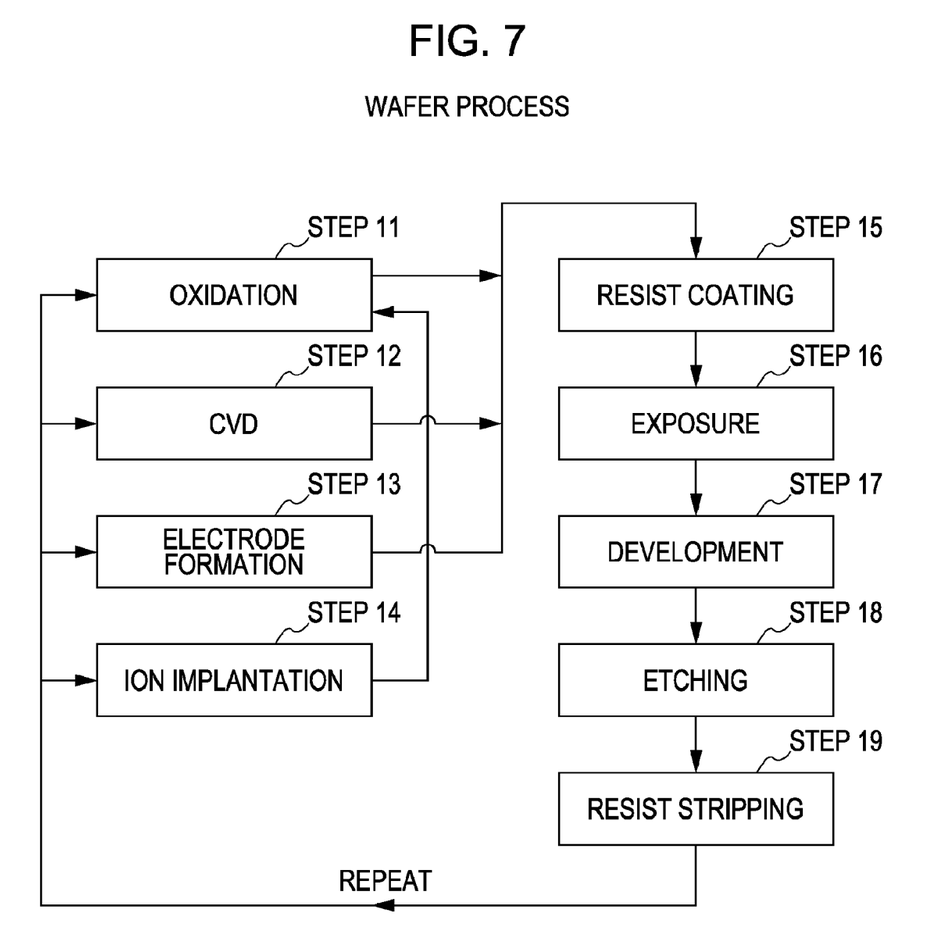
FIG. 7 is a flowchart for explaining details of a substrate process in step 4 of the flowchart shown in FIG. 6.

FIG. 7 is a detailed flowchart of the wafer process in step 4. In step 11 (oxidation), the wafer surface is oxidized. In step 12 (CVD), an insulation film is formed on the wafer surface. In step 13 (electrode formation), electrodes are formed on the wafer. In step 14 (ion implantation), ions are implanted into the wafer. In step 15 (resist process), a photoresist is coated on the wafer. In step 16 (exposure), the circuit pattern on the mask is transferred to the wafer by exposure using the exposure apparatus. In step 17 (development), the exposed wafer is developed. In step 18 (etching), the wafer is etched in an area other than the developed resist image. In step 19 (resist stripping), the resist which is not required any more after the etching is removed. By repeatedly performing the above-mentioned steps, the circuit pattern is formed on the wafer in a multiple way.

As many apparently widely different embodiments of the present invention can be made without departing from the sprit and scope thereof, it is to be understood that the invention is not limited to the specific embodiments thereof except as defined in the claims.

The entire disclosure of Japanese Patent Application No. 2006-246590 filed on Sep. 12, 2006 including claims, specification, drawings, and abstract is incorporated herein by reference in its entirety.

What is claimed is:

1. An illumination optical system arranged to illuminate an illumination target plane by using light from a light source, the illumination optical system comprising:
   a prism unit arranged to refract the light;
   an optical integrator arranged to form a plurality of light sources with light emerging from the prism unit; and
   an optical system arranged to introduce light emerging from the optical integrator to the illumination target plane,
   wherein the prism unit includes a pair of conical refractive surfaces having a conical concave refractive surface and a conical convex refractive surface, and a pair of pyramidal refractive surfaces having a pyramidal concave refractive surface and a pyramidal convex refractive surface, and at least one of the concave refractive surface and the convex refractive surface of one pair is disposed between the concave refractive surface and the convex refractive surface of the other pair,
   wherein a first subunit includes the conical concave refractive surface and the pyramidal concave refractive surface, and a second subunit includes the conical convex refractive surface and the pyramidal convex refractive surface,
   wherein at least one of the first subunit and the second subunit is movable in a direction of an optical axis of the illumination optical system such that an interval between the first subunit and the second subunit is variable, and
   wherein, when the interval between the first subunit and the second subunit varies, a distance between the refractive surfaces of the first subunit and a distance between the refractive surfaces of the second subunit remain substantially unchanged.

2. The illumination optical system according to claim 1, wherein the conical concave refractive surface and the pyramidal concave refractive surface are disposed close to the light source and facing thereto, and
   wherein the conical convex refractive surface and the pyramidal convex refractive surface are disposed close to the illumination target plane and facing thereto.

3. The illumination optical system according to claim 1, wherein an aperture stop blocking a part of the light emerging from the prism unit is disposed in the optical path between the prism unit and the illumination target plane.

4. The illumination optical system according to claim 1, wherein the conical concave refractive surface, the conical convex refractive surface, the pyramidal concave refractive surface and the pyramidal convex refractive surface each have a chamfered apex.

5. The illumination optical system according to claim 1, wherein the conical concave refractive surface, the pyramidal concave refractive surface, the conical convex refractive surface and the pyramidal convex refractive surface are disposed in the order named between the light source and the illumination target plane.

6. The illumination optical system according to claim 1, wherein, when the interval between the first subunit and the second submit varies, a size of an effective light source formed by the prism unit changes and a shape of the effective light source remains substantially unchanged.

7. An illumination optical system arranged to illuminate an illumination target plane by using light from a light source, the illumination optical system comprising:
   a prism unit arranged to refract the light;
   an optical integrator arranged to form a plurality of light sources with light emerging from the prism unit; and
   an optical system arranged to introduce light emerging from the optical integrator to the illumination target plane,
   wherein the prism unit includes a pair of conical refractive surfaces having a conical concave refractive surface and a conical convex refractive surface, and a pair of pyramidal refractive surfaces having a pyramidal concave refractive surface and a pyramidal convex refractive surface, and at least one of the concave refractive surface and the convex refractive surface of one pair is disposed between the concave refractive surface and the convex refractive surface of the other pair,
   wherein a first subunit includes the conical concave refractive surface, a second subunit includes the pyramidal concave refractive surface and the conical convex refractive surface, and a third subunit includes the pyramidal convex refractive surface,
   wherein the second subunit is disposed between the first subunit and the third subunit and is movable in a direction of an optical axis of the illumination optical system such that an interval between the first subunit and the second subunit is variable,
   wherein, when the interval between the first subunit and the second subunit varies, a distance between the refractive surfaces of the second subunit remains substantially unchanged, and
   wherein the second subunit includes a prism having the pyramidal concave refractive surface in an incident surface thereof and the conical convex refractive surface in an emergent surface thereof.

8. The illumination optical system according to claim 7, wherein the conical concave refractive surface, the pyramidal concave refractive surface, the conical convex refractive surface and the pyramidal convex refractive surface are disposed in the order named between the light source and the illumination target plane.

9. The illumination optical system according to claim 7, wherein an aperture stop blocking a part of the light emerging from the prism unit is disposed in the optical path between the prism unit and the illumination target plane.

10. The illumination optical system according to claim 7, wherein the conical concave refractive surface, the conical convex refractive surface, the pyramidal concave refractive surface and the pyramidal convex refractive surface each have a chamfered apex.

11. The illumination optical system according to claim 7, wherein, when the interval between the first subunit and the second submit varies, a size of an effective light source formed by the prism unit changes and a shape of the effective light source remains substantially unchanged.

12. An exposure apparatus including an illumination optical system arranged to illuminate an illumination target plane by using light from a light source, the illumination optical system including,
   a prism unit arranged to refract the light;
   an optical integrator arranged to form a plurality of light sources with light emerging from the prism unit; and
   an optical system arranged to introduce light emerging from the optical integrator to the illumination target plane,
   wherein the prism unit includes a pair of conical refractive surface having a conical concave refractive surface and a conical convex refractive surface, and a pair of pyramidal refractive surface having a pyramidal concave refractive surface and a pyramidal convex refractive surface, and at least one of the concave refractive surface and the convex refractive surface of the one pair is disposed between the concave refractive surface of the other pair and the convex refractive surface of the other pair,
   wherein a first subunit includes the conical concave refractive surface and the pyramidal concave refractive surface, and a second subunit includes the conical convex refractive surface and the pyramidal convex refractive surface,
   wherein at least one of the first subunit and the second subunit is movable in a direction of an optical axis of the illumination optical system such that an interval between the first subunit and the second subunit is variable,
   wherein, when the interval between the first subunit and the second subunit varies, a distance between the refractive surfaces of the first subunit and a distance between the refractive surfaces of the second subunit remain substantially unchanged,
   wherein the illumination optical system is arranged to illuminate an original; and
   a projection optical system arranged to project an image of a pattern of the original onto a substrate.

13. A device manufacturing method, comprising:
   exposing a substrate by using an exposure apparatus that includes an illumination optical system and a projection optical system, wherein the illumination optical system is arranged to illuminate an original located at an illumination target plane by using light from a light source and the projection optical system is arranged to project an image of a pattern of the original onto the substrate, and
   developing the substrate,
   wherein the illumination optical system includes:
      a prism unit arranged to refract the light;
      an optical integrator arranged to form a plurality of light sources with light emerging from the prism unit; and
      an optical system arranged to introduce light emerging from the optical integrator to the illumination target plane,
      wherein the prism unit includes a pair of conical refractive surfaces having a conical concave refractive surface and a conical convex refractive surface, and a pair of pyramidal refractive surfaces having a pyramidal concave refractive surface and a pyramidal convex refractive surface, and at least one of the concave refractive surface and the convex refractive surface of one pair is disposed between the concave refractive surface and the convex refractive surface of the other pair, wherein a first subunit includes the conical concave refractive surface and the pyramidal concave refractive surface, and a second subunit includes the conical convex refractive surface and the pyramidal convex refractive surface, wherein at least one of the first subunit and the second subunit is movable in a direction of an optical axis of the illumination optical system such that an interval between the first subunit and the second subunit is variable, and wherein, when the interval between the first subunit and the second subunit varies, a distance between the refractive surfaces of the first subunit and a distance between the refractive surfaces of the second subunit remain substantially unchanged.

* * * * *